United States Patent
Teklemariam et al.

(10) Patent No.: US 7,977,946 B2
(45) Date of Patent: Jul. 12, 2011

(54) INTERVENTIONAL MRI MAGNETIC FIELD GENERATOR BASED ON PERMANENT MAGNETS

(76) Inventors: Grum Teklemariam, Arlington, VA (US); Jianyu Lian, Quincy, MA (US)

( * ) Notice: Subject to any disclaimer, the term of this patent is extended or adjusted under 35 U.S.C. 154(b) by 197 days.

(21) Appl. No.: 12/305,651

(22) PCT Filed: Jun. 25, 2007

(86) PCT No.: PCT/US2007/014663
§ 371 (c)(1),
(2), (4) Date: Dec. 18, 2008

(87) PCT Pub. No.: WO2008/002506
PCT Pub. Date: Jan. 3, 2008

(65) Prior Publication Data
US 2009/0206837 A1    Aug. 20, 2009

Related U.S. Application Data

(60) Provisional application No. 60/816,365, filed on Jun. 26, 2006.

(51) Int. Cl.
*G01V 3/00* (2006.01)

(52) U.S. Cl. ......................... 324/319; 324/320; 335/296

(58) Field of Classification Search ................. 324/319, 324/320; 335/296
See application file for complete search history.

(56) References Cited

U.S. PATENT DOCUMENTS

| | | | | |
|---|---|---|---|---|
| 4,931,760 A * | 6/1990 | Yamaguchi et al. | ........... | 335/306 |
| 5,438,264 A * | 8/1995 | Takeshima et al. | ........... | 324/319 |
| 6,680,663 B1 * | 1/2004 | Lee et al. | ........... | 335/306 |
| 6,940,378 B2 * | 9/2005 | Miller et al. | ........... | 335/296 |

* cited by examiner

*Primary Examiner* — Louis M Arana
(74) *Attorney, Agent, or Firm* — Bay State IP; Adam J. Bruno

(57) ABSTRACT

A magnet assembly primarily for use in MRI Interventional applications having an array of four mam permanent magnets that are spaced-apart and arranged into a ring-like geometry with six easy-access openings The magnetization direction in each permanent magnet is anti-parallel to any other adjacent permanent magnet in the πng assembly while it is parallel to any other permanent magnet in the array that is oppositely located just as in a quadrupolar system Such an arrangement has the advantage of concentrating the magnetic field inside the nng enclosure while minimizing magnetic field generated outside Together, these four spatially spaced-apart permanent magnets create a very homogeneous and strong magnetic field in the central enclosure with two orthogonal access paths and one parallel access path to the enclosure Through one access pathway a patient can be inserted while through the other pathways a doctor can fully access the patient.

16 Claims, 13 Drawing Sheets

INTERVENTIONAL MRI MAGNETIC FIELD GENERATOR BASED ON PERMANENT MAGNETS

PRIORITY CLAIM

This application claims priority from U.S. Provisional Application 60/816,365, filed Jun. 26, 2006.

BACKGROUND OF THE INVENTION

1. Field of the Invention

The invention relates to permanent magnet designs that can generate very strong and highly homogeneous fields primarily for interventional and MRT use.

2. Description of the Related Art

In MRI interventional applications it is desirable to have a system that scans the patient while a surgeon accesses the patient just as on a surgical table and is guided by real-time images in order to perform the interventional procedures. Most MRI systems available today are not well suited for this purpose. The traditional cylindrical or solenoidal magnets prevent access to the patient whereas the open systems are not open enough and offer only limited access.

Although the ideal system to perform such procedures is probably a planar configuration it is not a very efficient geometry. Alternatively, a more enclosed system offers better homogeneity and stronger field. However, accessing the patient becomes more difficult and consequently a comprise system is required.

An eight-element Halbach ring array magnet, FIG. 1, with four of the alternate elements removed offers a suitable configuration. Such a system is depicted in FIG. 2 and provides three orthogonal paths to the central enclosure. These access paths are the one parallel to the cylindrical axis and the other two orthogonal access pathways are parallel to the plane perpendicular to the cylindrical axis. Of the two pathways perpendicular to the cylindrical axis, one path can be used for inserting a patient while the other, orthogonal path gives surgeons an easy access to the patient so that they can perform real-time guided interventional procedures during the MRI scan. This system forms a quadrupolar magnetization orientation with respect to the four elements and generates a dipolar field in the central enclosure. The design combines the benefits of a strong field in the imaging region while generating minimal fringe fields.

For whole-body scanning, the invention offers such an unprecedented opening in MRI magnet design, the very open, patient friendly environment enables the use of the magnet for routine diagnostic applications as well. Moreover, the opening is also ideal for weight bearing or stand-up patient positions and can be used in applications that require such patient loadings as well.

In contrast to more traditional magnet designs, permanent magnets offer a great advantage in terms of cost and maintenance requirements. The dominant MRI systems and in particular interventional systems are mostly based on superconducting technology. It is well known that these systems are expensive to purchase and maintain because of the expensive cryogenic fluids and parts that require periodic refilling and servicing. Therefore, the current invention offers an alternative with the capability of generating up to 1.0 Tesla or greater fields in imaging regions well above 40 cm DSV while keeping magnet size, weight and cost within reasonable limits.

SUMMARY OF THE INVENTION

Based on the above considerations, it is an object of the present invention to provide a magnet system that is suitable for interventional MRI purposes with easy and complete access to a patient by doctors and surgeons during real-time MRI scanning.

A main objective of this invention is that the magnet system be based on permanent magnets arranged in a quadrupolar array. The magnetization directions are therefore oriented so that adjacent permanent magnet elements have anti-parallel orientations while opposite ones have parallel orientations with respect to each other.

Accordingly, such an arrangement of permanent magnet arrays has the effect of concentrating the flux generated in the center while minimizing the flux externally. Therefore, the system can be very efficient and have well contained fringe fields making it ideal for MRI scanning in general and particularly for interventional purposes.

A further feature of this invention relates to varying the magnetization orientations beyond the quadrupolar arrangement in order to improve homogeneity in the imaging region.

Another feature of this invention for controlling homogeneity is obtained by varying the element shapes. For example, a trapezoidal shape provides more opening whereas a square shape improves homogeneity but at the expense of constricting access. Therefore, the right trade-off between space and homogeneity is established in conjunction with suitable aspect ratios for the element shapes.

A major invention of the current system relates to the easy access provided in between the quadrupolar arrays of the magnet configuration. Through one path a patient can be inserted while through the other, orthogonal path a surgeon can access the patient. This gives the surgeon the ability to perform real-time interventional procedures during an MRI scan. A third pathway is also provided along the cylindrical axis.

A further feature of this aspect of the invention is the major geometric orientation of the permanent magnet columns. They can be arranged so that they stand vertically. Two orthogonal access pathways, perpendicular to the cylindrical axis, are easily provided in this orientation. Still, another orientation for the columns is such that they can be oriented horizontally and again two orthogonal access pathways perpendicular to the cylindrical axis are easily available.

In one preferred embodiment of this invention there are provided yokes externally two connect the permanent magnet arrays for further efficiency enhancement. The yokes are designed to connect flux pathways that connect any two elements and are not used where the flux pathways are opposing each other.

In yet another preferred embodiment of this invention, there are provided poles at the tips of the permanent magnet elements facing the imaging region for enhancing the homogeneity of the dipolar field in the central enclosure. The poles are made of ferromagnetic material and also have the effect of averaging out the magnet material non-uniformities forming a constant potential surface for flux to emanate from in the imaging region. Moreover, the poles can be shaped to minimize saturation and modifying the flux flow to improve homogeneity.

A further aspect of this invention is the use of the quadrupolar magnet system for routine MR scanning offering the patient a very open environment. The ideal configuration for this purpose is the vertically stood magnet columns. Moreover, this orientation of the magnets is also ideal for scanning patients in standing postures and weight bearing applications.

Other aspects of the invention will become clear from the drawings and detailed description to follow.

BRIEF DESCRIPTION OF THE DRAWINGS

The accompanying drawings illustrate the main aspects of the specification and together with the detailed description establish the advantages of the invention.

FIG. 3 2D finite-difference model of System 200 in FIG. 2 displaying one symmetric quadrant. The dimensions are in centimeters.

FIG. 5 2D finite-difference model of System 300 in FIG. 4 displaying one symmetric quadrant. The dimensions are in centimeters.

FIG. 10 2D finite-difference model of System 500 in FIG. 9 with a yoke, pole and pole tips. The dimensions are in centimeters.

FIG. 13 3D field calculation of a realistic rendering of System 200 in FIG. 2. The permanent magnet blocks are 1.2 meters in height and the cross-sectional dimensions are the same as the finite-difference model of System 200 in FIG. 3.

DETAILED DESCRIPTION OF THE PREFERRED EMBODIMENT

Figure 1:
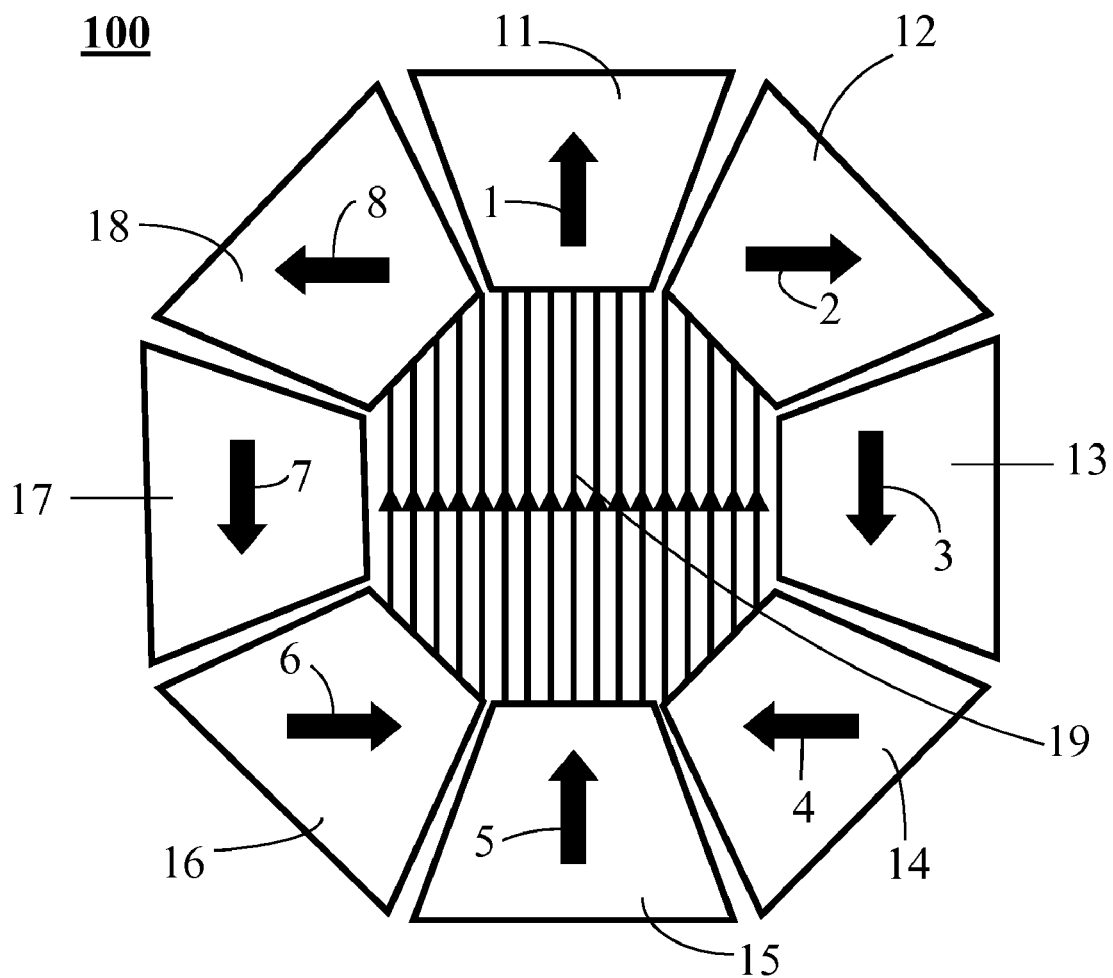
FIG. 1 Axial cross-sectional view of an Eight-element Halbach array.

System 100 of FIG. 1 shows a typical Eight-element Halbach array. The elements are depicted by permanent magnet (PM) segments 11-18 and exhibit magnetization orientations 1-8 that differ by 90° from segment to segment along the ring array. As is well known, this arrangement has the property of concentrating all the flux generated inside the ring while there is only minimal flux outside the ring. Furthermore, the flux 19 generated inside forms a very uniform dipolar field. Consequently, this system would make an ideal MRI scanner. However, for interventional applications, an access pathway is desired for surgeons to perform procedures on a patient.

Figure 2:
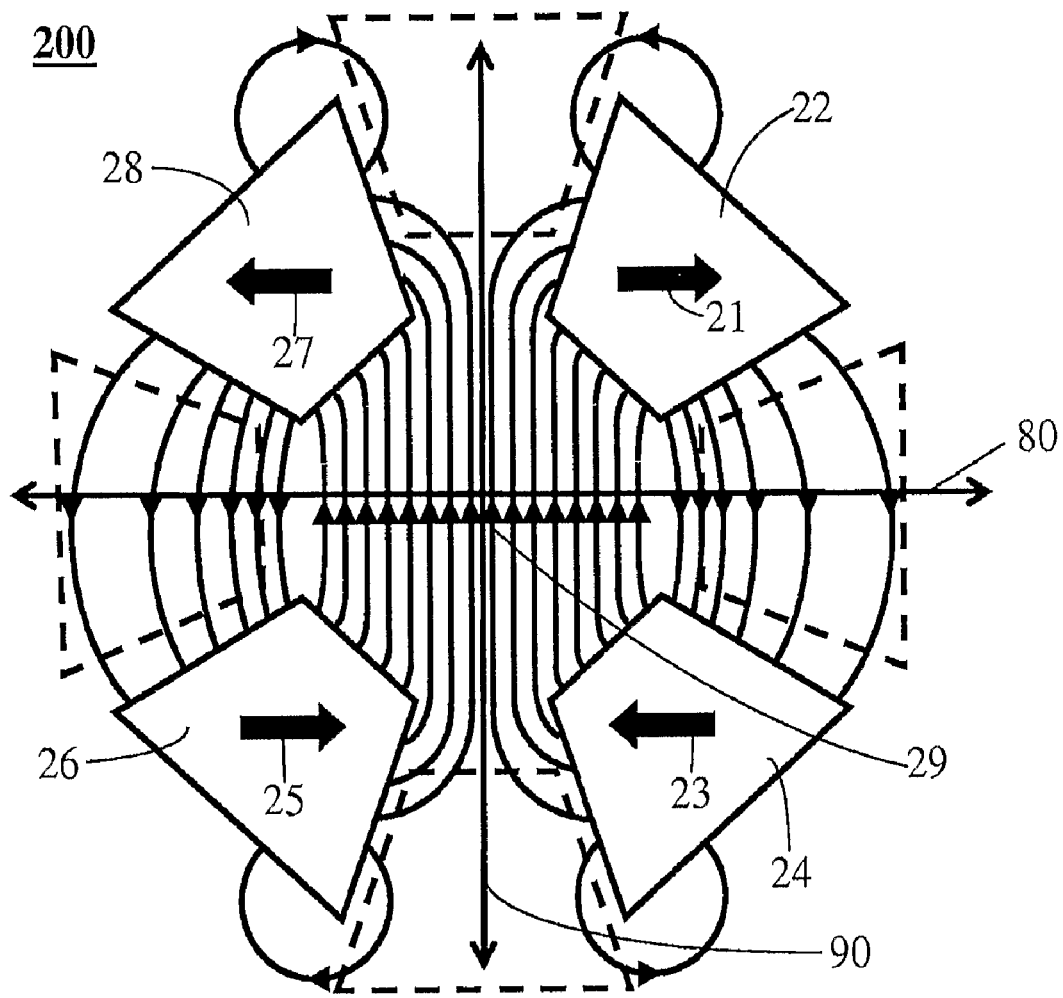
FIG. 2 Axial cross-sectional view of a quadrupolar permanent magnet array of this invention with horizontally oriented magnetization obtained by removing alternate array elements 11, 13, 15 and 17 of the Eight-element Halbach array of FIG. 1.

FIG. 2 shows a cross-sectional view of a Four-element Halbach array. It is obtained from system 100 of FIG. 1 by removing segments 11, 13, 15 and 17. The system 200 forms a quadrupolar ring array with PM segments 22, 24, 26 and 28. The magnetization orientations 21, 23, 25 and 27 are therefore anti-parallel to each other for adjacent segments while they are parallel for opposite segments. Thus, orientations 21 and 23, 23 and 25, 25 and 27 and 27 and 21 are anti-parallel, whereas orientations 21 and 25 are parallel to each other, and 23 and 27 are parallel to each other. System 200, like system 100, still forms a dipolar field 29 despite the significant symmetry breaking by removing segments 11, 13, 15 and 17 of system 100. The dipolar field 29 has reduced homogeneity compared to 19; however by scaling up the separation between the segments 22, 24, 26 and 28 much of it can be regained. This scaling up has the further advantage of providing significant access pathways for inserting a patient along one direction and a surgeon along the orthogonal pathway.

Figure 3:
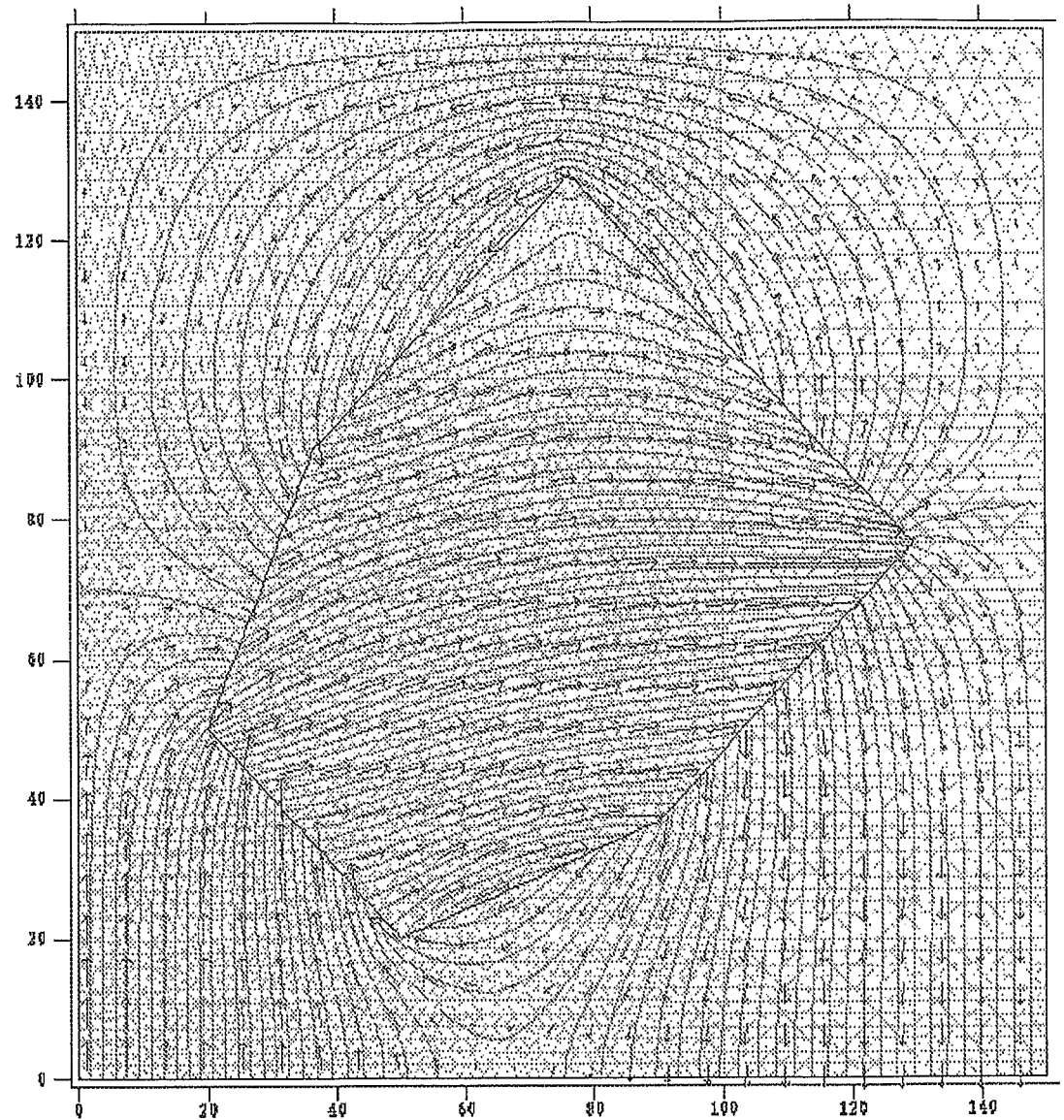

A 2D quadrant, finite-difference field model of system 200 is shown in FIG. 3. The dimensions have been optimized to yield a central field of 5960 G. This system has a field variation of about 140 G over a 40 cm DSV centered on the coordinates (0,0). In the model of FIG. 3, system 200 is infinite in extent into and out of the plane. For the PM blocks 22, 24, 26 and 28 a 47 MGOe energy Neodymium-Iron-Boron (NdFeB) material was used.

Figure 4:
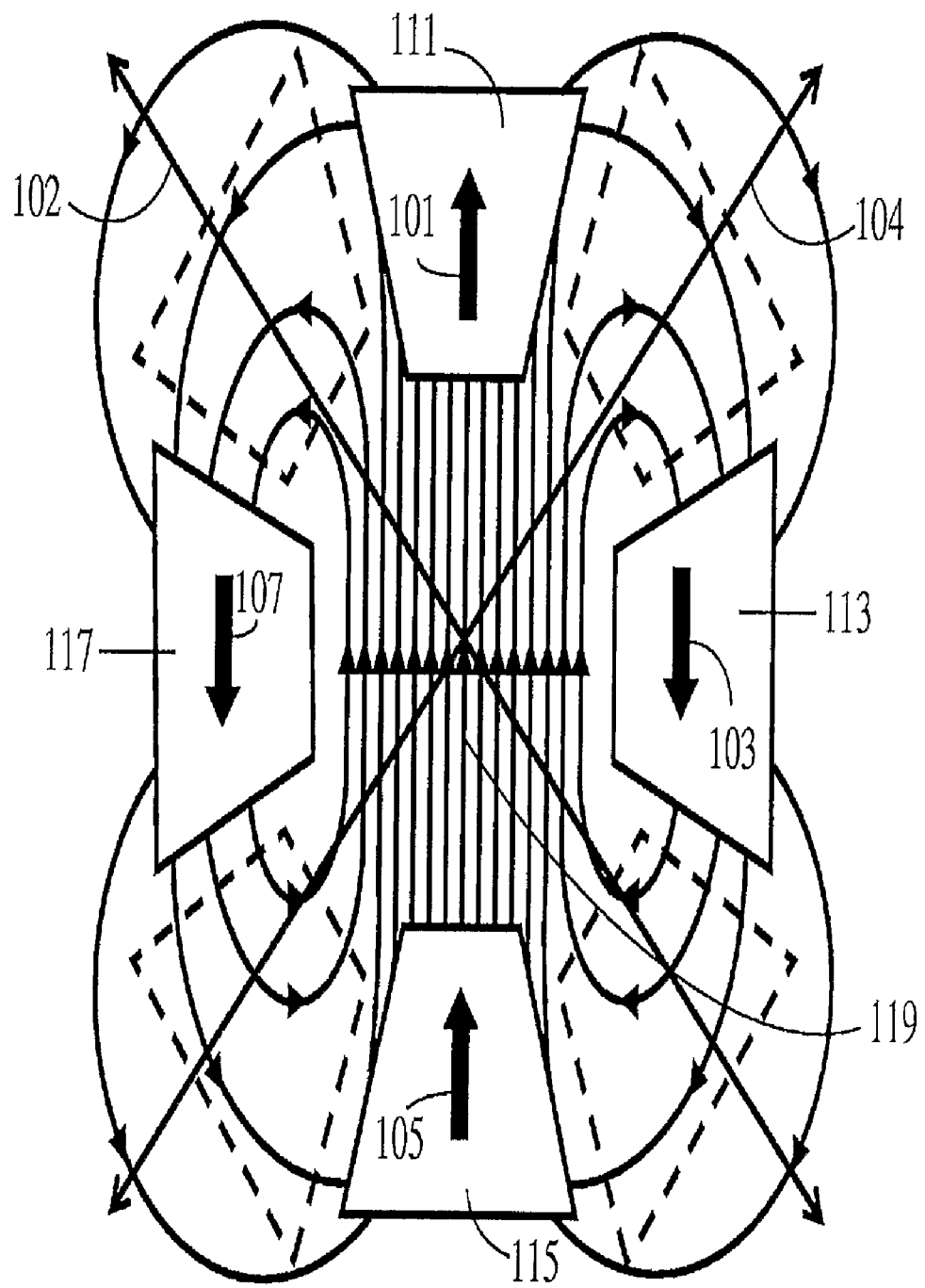
FIG. 4 Axial cross-sectional view of a quadrupolar permanent magnet array of this invention with vertically oriented magnetization obtained by removing alternate array elements 12, 14, 16 and 18 of the Eight-element Halbach array of FIG. 1.

Although system 200 is formed from segments 12, 14, 16 and 18 of system 100 it could just as well have been formed from segments 11, 13, 15 and 17 of system 100. Then, the orientations 1, 3, 5 and 7 of system 100 would be preferred for a dipolar field. This alternate magnet is depicted in FIG. 4 as system 300. It is composed of magnet array elements 111, 113, 115 and 117 with magnetization orientations 101, 103, 105 and 107. However, as is shown in FIG. 4, the dipolar field 119 generated in system 300 is actually at 45° to the patient access pathway 102 or 104 and therefore the RF field orientations for transmit/receive body coils around the patient will not be orthogonal to the dipolar field when a patient is oriented along these paths. Consequently, the arrangement 200 is preferred if a patient is inserted along the pathways 80 or 90.

Figure 5:
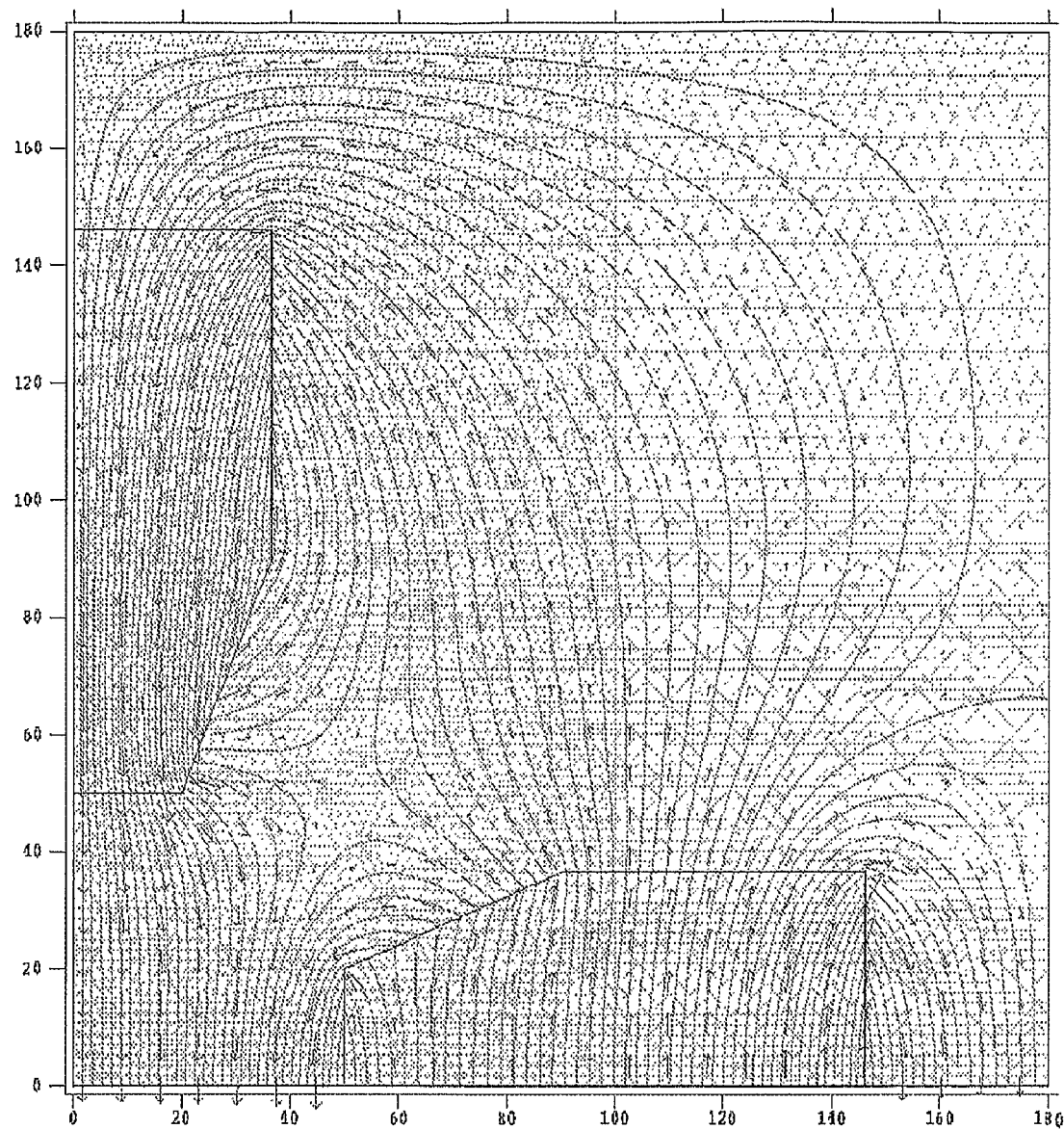

System 300 can be analyzed by a finite-difference field calculation and a 2D quadrant model is shown in FIG. 5. This system yields a central field of about 6100 G and has a field variation of about 130 G over a 40 cm DSV centered on the coordinated (0,0). The PM blocks 111, 113, 115 and 117 are composed of 47 MGOe NdFeB magnet material.

Figure 6:
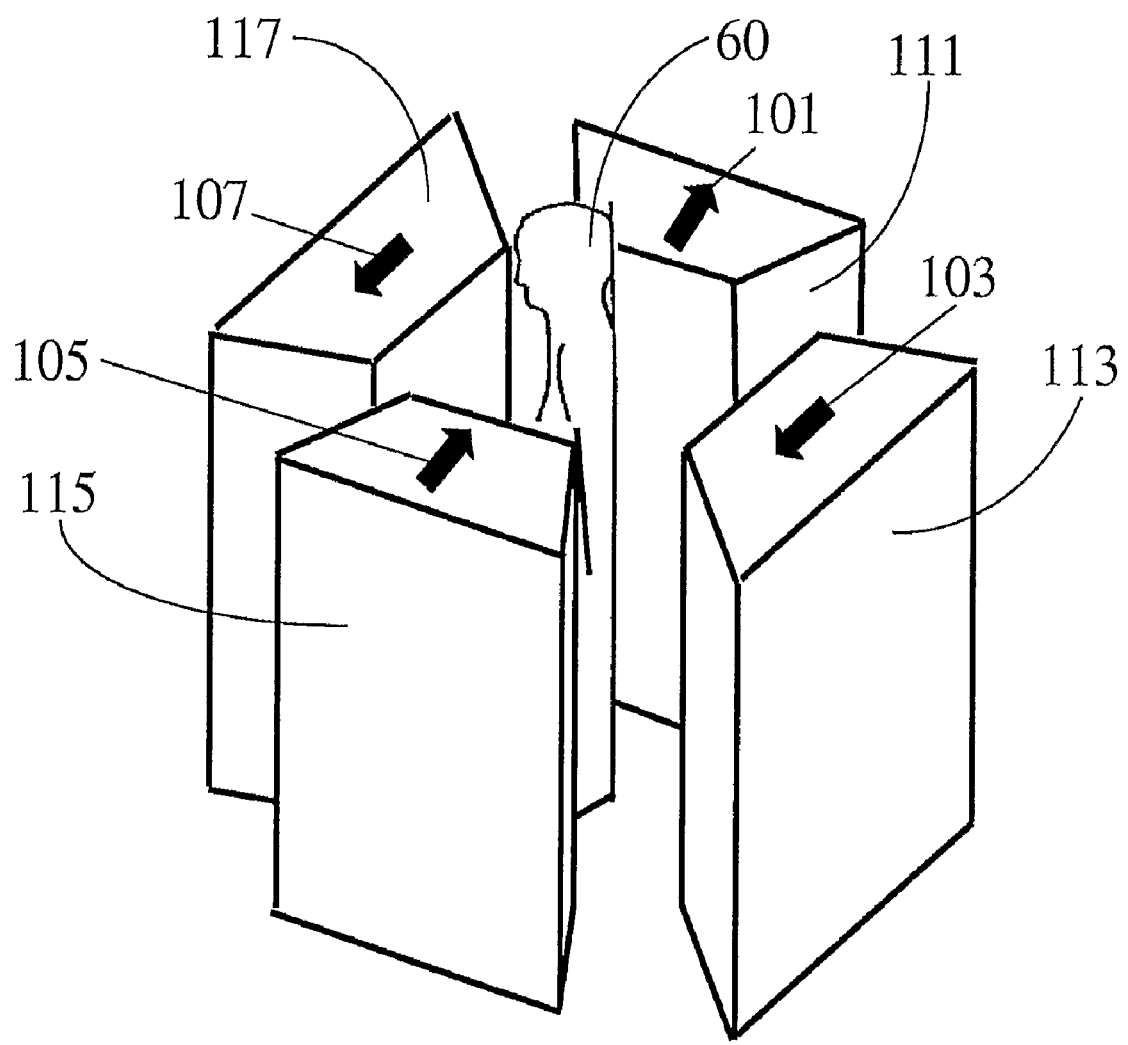
FIG. 6 Vertically oriented quadrupolar permanent magnet array of this invention similar to System 300.

FIG. 6 shows a patient standing up inside system 300. When the patient is in this position this system is preferred because RF coils placed against elements 103 and 107 will have an orthogonal orientation with respect to the dipolar field 119. Therefore, for weight bearing scans and stand-up postures this system simplifies RF and gradient coil designs compared to system 200.

Figure 7:
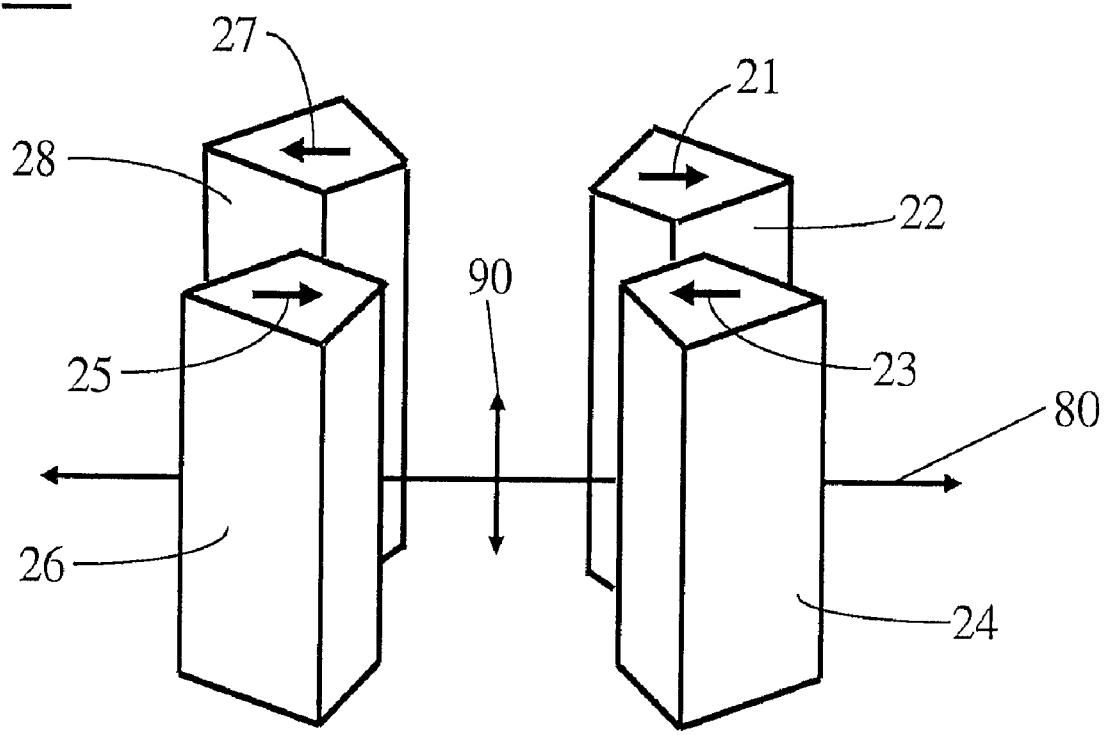
FIG. 7 Illustration of patient and surgeon access in the vertically oriented quadrupolar permanent magnet array of this invention.
Figure 8:
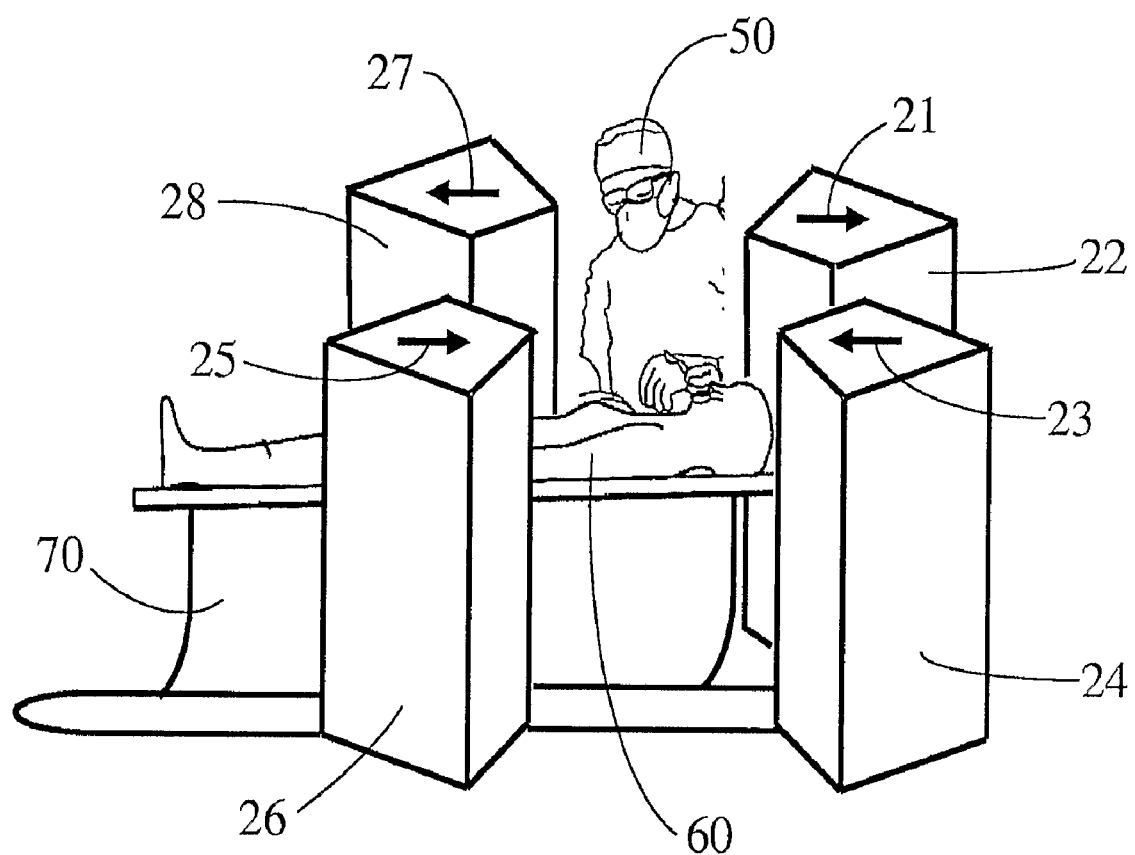
FIG. 8 Illustration of patient positioning and surgeon access to patient of System 400.

In one preferred embodiment of this invention, the system 200 is oriented vertically with the segments 22, 24, 26 and 28 erected upright. FIG. 7 depicts this embodiment. Then, FIG. 8 illustrates how a patient 60 on a table 70 can be inserted in the system 400 through pathway 80 while a surgeon 50 can very easily access the patient 60 through the orthogonal pathway 90. This capability is very crucial for interventional procedures conducted during real-time MRI scanning. Moreover, system 400 can be used for routine diagnostic scanning as well and offer a very open and comfortable patient environment.

Figure 12:
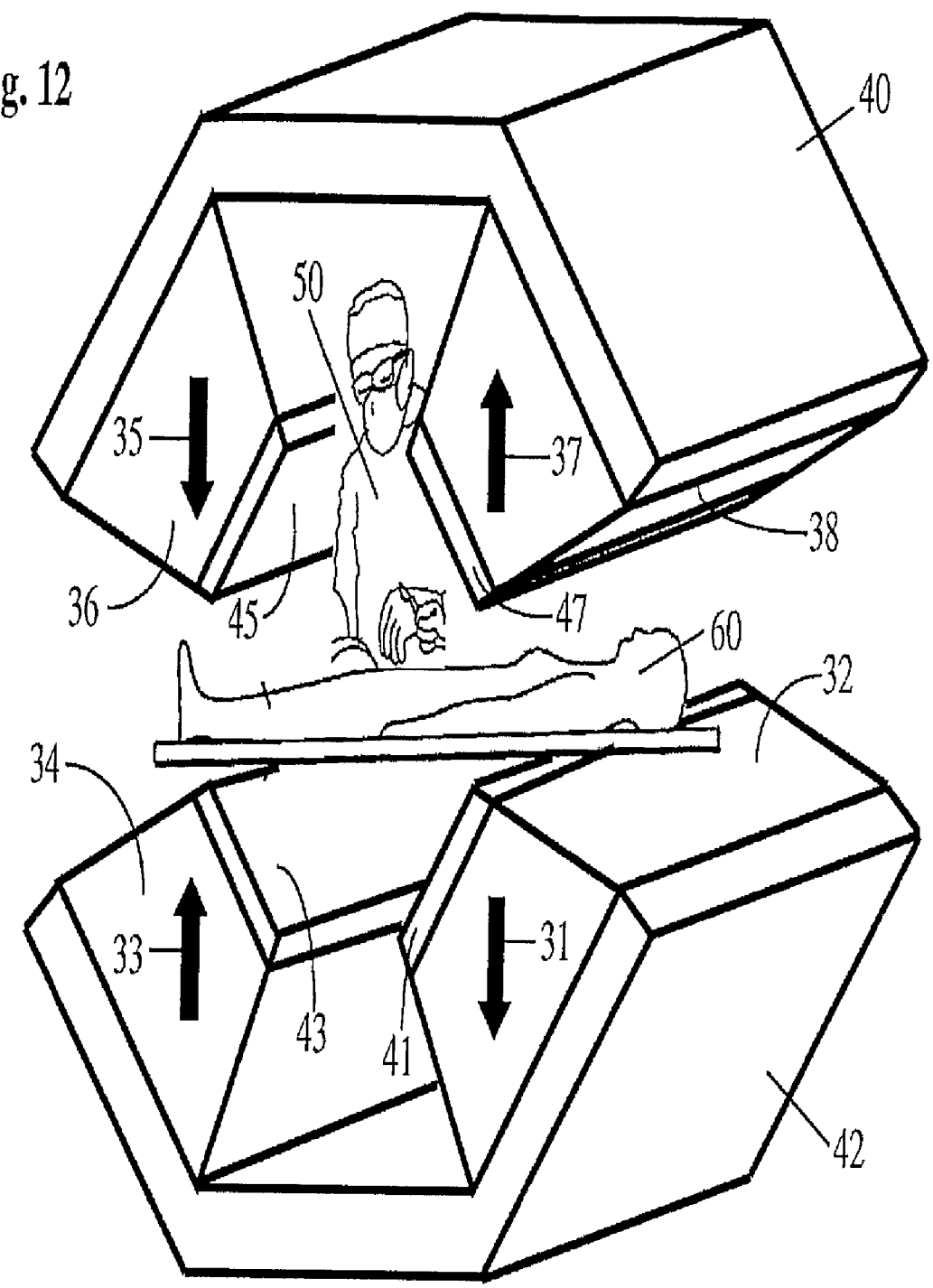
FIG. 12 Illustration showing patient and surgeon in a yoked, horizontally oriented quadrupolar permanent magnet array with poles.

In another embodiment of this invention, the system 200, as is shown in FIG. 2, can be used with the permanent magnet arrays 22, 24, 26 and 28 oriented horizontally. In this configuration, the patient can be inserted through either pathways 80 or 90 and the surgeon can access the patient as depicted in FIG. 12 for example.

Figure 9:
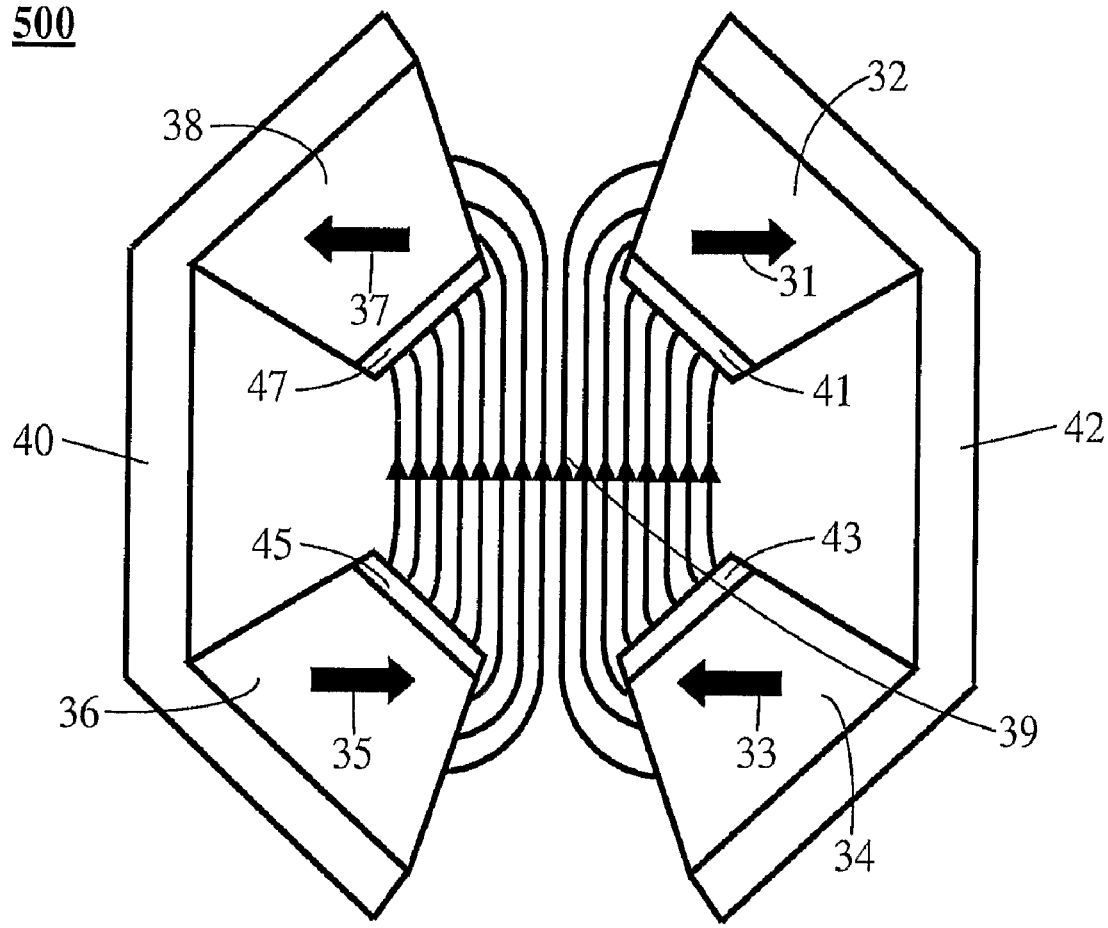
FIG. 9 Axial cross-sectional view illustrating a yoked quadrupolar permanent magnet array with poles of this invention.

In a further embodiment of this invention, the use of a yoke can shape and alter the dipolar field 29. Poles used along the surfaces of the elements 22, 24, 26 and 28 facing the inside of system 200 can further shape and enhance the dipolar field 29 as well. In particular, FIG. 7 shows such a system for the horizontal orientation of system 200. Thus, system 500 of FIG. 9 depicts permanent magnet arrays 32, 34, 36 and 38 configured horizontally with the orientations 31, 33, 35 and 37, and yoked with yokes 40 and 42 where the flux lines connect those array elements. In addition, poles 41, 43, 45 and 47 are attached on arrays 32, 34, 36 and 38 respectively, and further shape and enhance the dipolar field 29.

Figure 10:
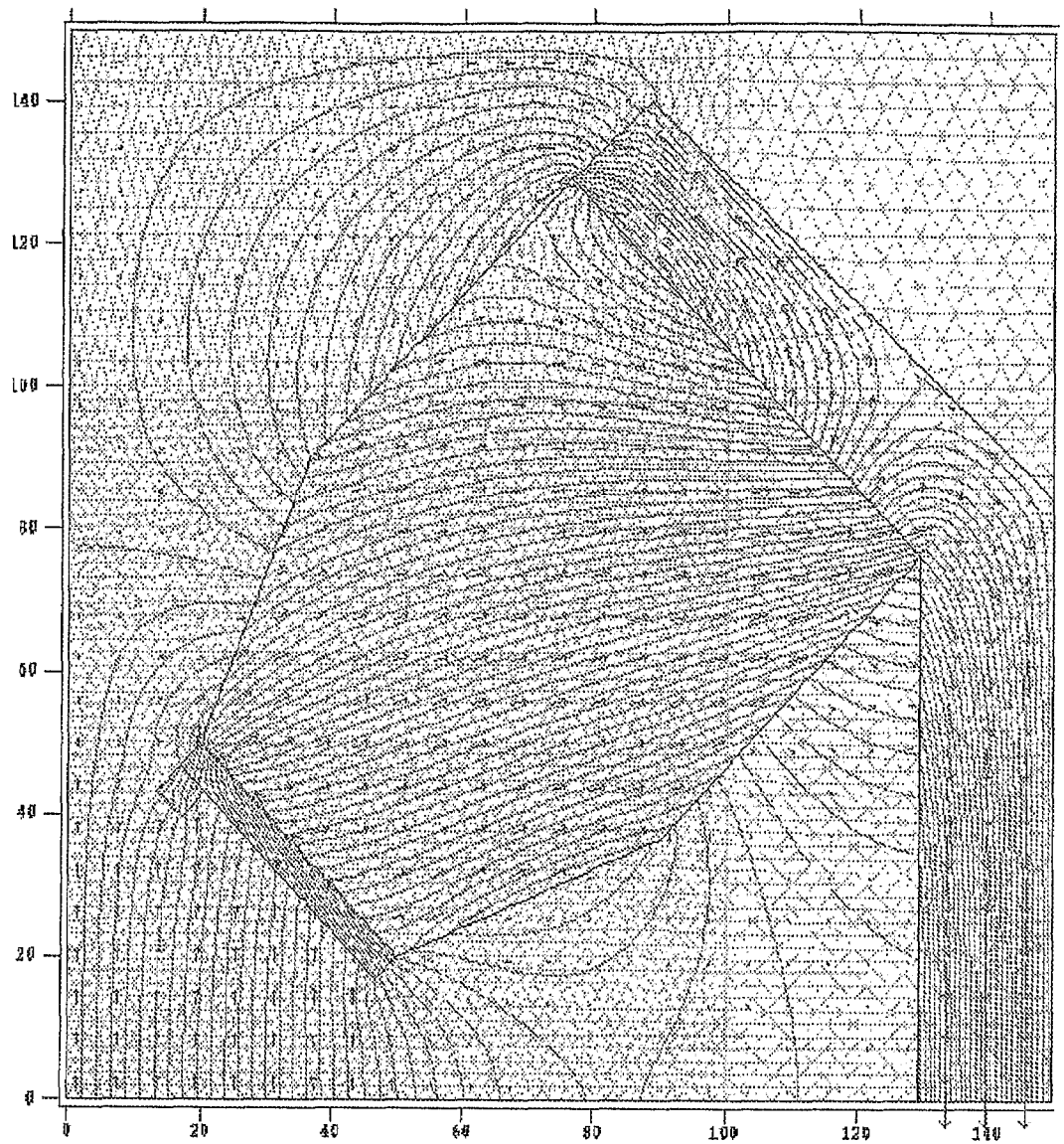

FIG. 10 displays results of a finite-difference calculation of a 2D quadrant model of System 500 with the yokes, pole and in the calculation a pole tip has been included for further homogenizing the central field. This model yields a central field of 7015 G with an increased inhomogeneity to 160 G variation over 40 cm DSV. The results show that without the yokes there is significant flux leakage and the poles can be further sculpted to homogenize the field. Moreover, the magnetization orientations 31, 33, 35 and 37 can tipped away slightly from the parallel orientations shown in FIG. 9 for further homogenizing the dipolar magnetic field 39.

Figure 11:
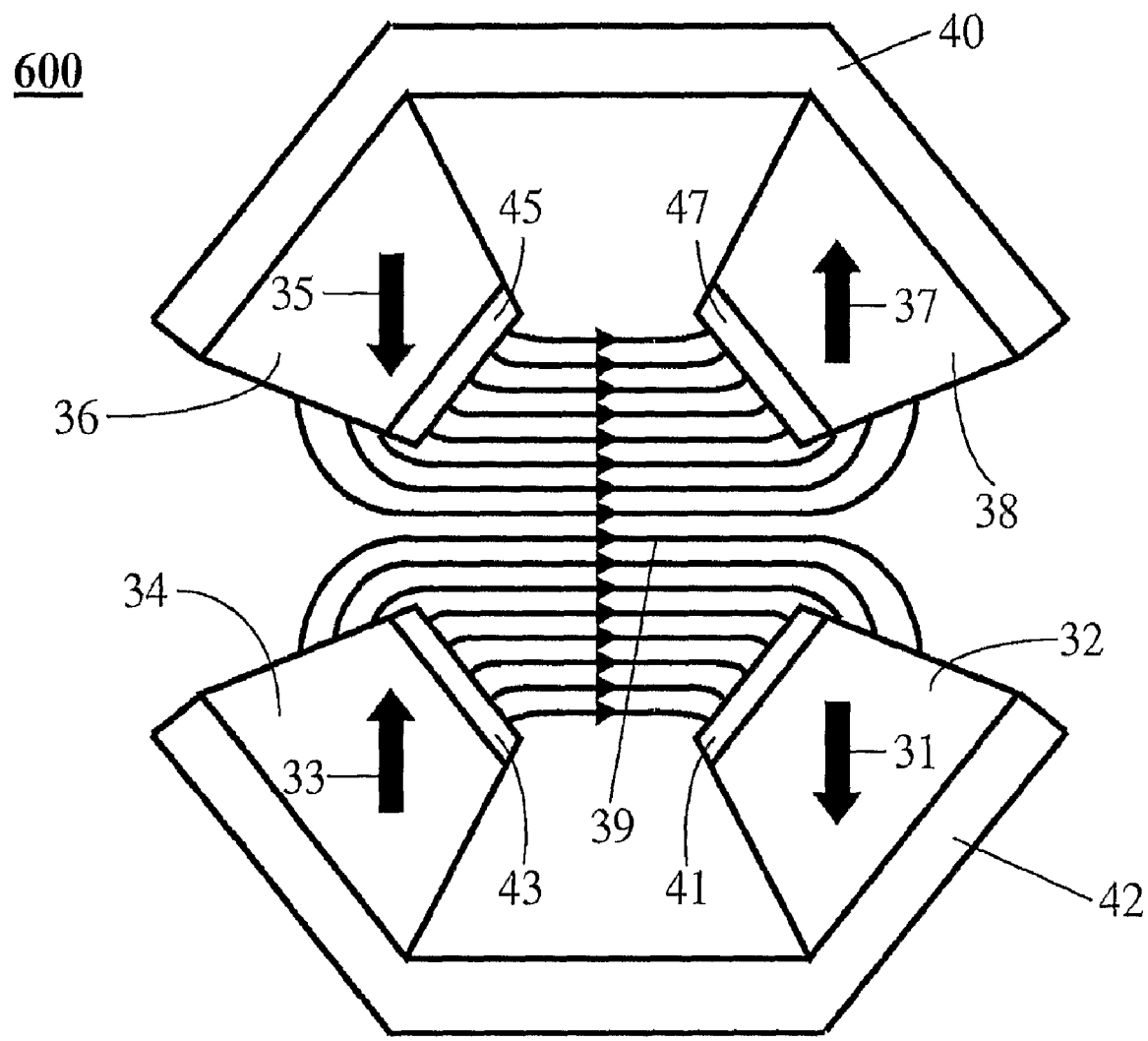
FIG. 11 Axial cross-sectional view illustrating a yoked quadrupolar permanent magnet array and poles rotated 90 degrees relative to the orientation shown in FIG. 9.

FIG. 11 depicts system 600 which is a rotation of system 500 by 90°. As shown in FIG. 12 a patient can be inserted through pathway 90 of system 600 while a surgeon can access the patient along the length of the permanent magnet array elements 32, 34, 36 and 38.

Figure 13:
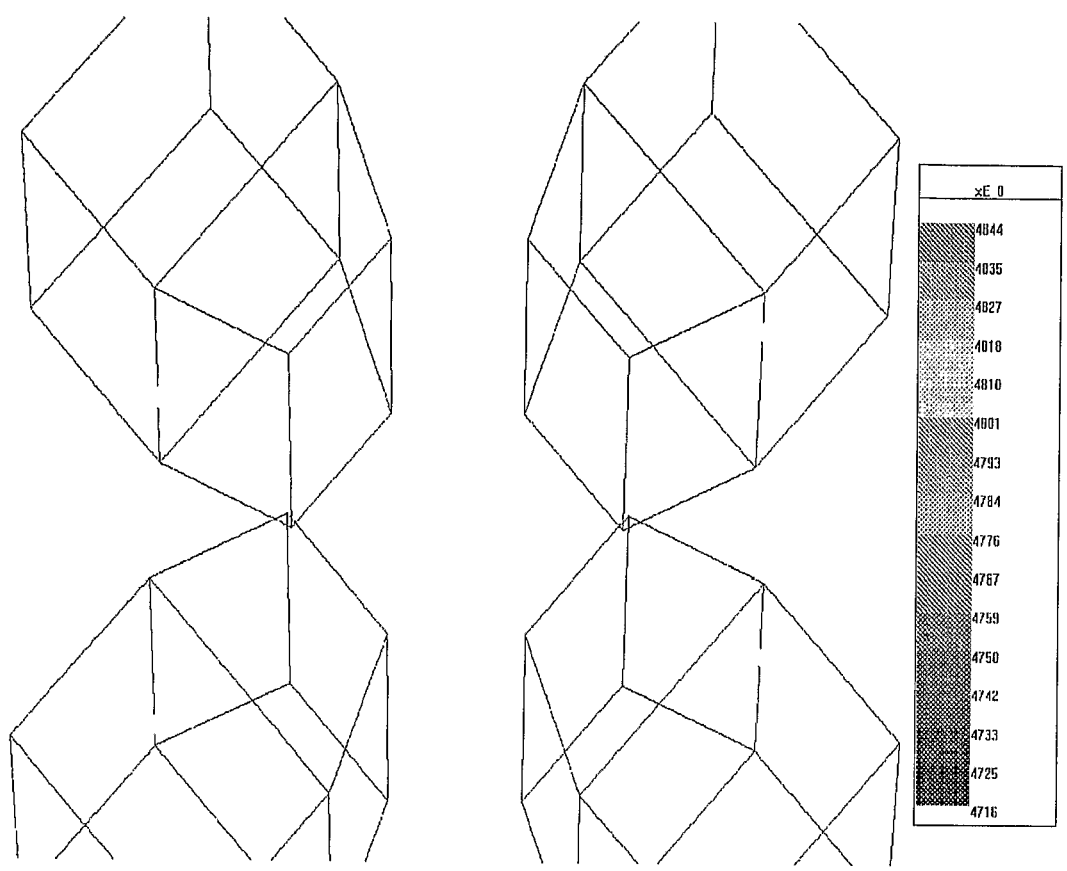

Finally, FIG. 13 shows a 3D calculation for a realistic rendering of System 200 with a vertical height of 1.2 meters of the magnet that was analyzed in FIG. 3. As can be seen from the figure the central field is about 4800 G with a field variation of about 128 G over a 40 cm DSV. This calculation confirms that a realistic model can indeed be produced with the kinds of fields and uniformity calculated in the 2D models of this invention.

Altogether, this new magnet has substantial benefits over previous or conventional magnet designs that are based on all three magnet sources: resistive, permanent and superconducting magnet technologies. This breakthrough in permanent magnet design can yield practical designs for whole-body MRI permanent magnet based systems of field strengths up to 1.0 T or more.

The drawings and descriptions while demonstrating the main objects of the invention, together with the claims below are in on way meant to limit the scope and spirit of the invention. Changes in form and details of the invention will be understood not to depart from the current invention.

What is claimed is:

1. A magnet system for use in interventional MRI applications, the magnet system comprising:
    a magnet array, wherein the magnet array includes at least four equally spaced-apart column-like permanent magnets, wherein the permanent magnets are disposed to be arranged into a ring-like structure to form an inner cylindrical enclosure,
    each permanent magnet is magnetized such that the magnetization orientation is disposed to be orthogonal to a cylindrical axis of the inner enclosure
    thereby enabling the magnetization orientations of the permanent magnets to form a quadrupolar arrangement and generate a dipolar magnetic field inside the inner enclosure;
    a pair of access ways, wherein the pair of access ways is located through the spaced-apart openings of the inner enclosure and a third access way parallel to the cylindrical axis;
    at least two yokes disposed to connect pairs of permanent magnets along flux pathways that connect any two permanent magnets; and
    at least four poles, wherein at least one pole is located on each permanent magnet to shape and enhance the dipolar magnetic field generated in the inner enclosure.

2. The magnet system of claim 1 wherein each permanent magnet is disposed to be an alloy of the Neodymium-Iron-Boron type.

3. The magnet system of claim 1 wherein the configuration of the permanent magnets of the magnet array is disposed to enable a subject to be inserted through the inner enclosure for the purposes of examination.

4. The magnet system of claim 1, wherein the magnetization orientation of each permanent magnet is disposed to be anti-parallel with respect to each adjacent permanent magnet and parallel with respect to each opposite permanent magnet.

5. The magnet system of claim 4, wherein the configuration of the magnetization orientations is disposed to be forty-five degrees with respect to the inner surfaces of each permanent magnet.

6. The magnet system of claim 1, wherein the magnetic field internally is dipolar and is disposed to exhibit minimal field generation externally.

7. The magnet system of claim 1, wherein one of the access ways provides a means for inserting a subject and wherein the other access way provides a means for a medical personnel to examine and or treat the subject.

8. The magnet system of claim 1, further comprising at least two yokes, each connecting pairs of permanent magnets along a plurality of flux pathways that connect the permanent magnets and forming mechanical support.

9. The magnet system of claim 8, wherein the magnetization orientations are disposed to be slightly tilted away from the orientation in claim 5 to compensate for the yokes to alter the dipolar field in the inner enclosure.

10. The magnet system of claim 1, further comprising at least four poles, wherein one pole is located on each permanent magnet disposed to face the inner enclosure.

11. The magnet system of claim 1, wherein the magnet system is disposed to be erected vertically.

12. The magnet system of claim 11, wherein a subject is inserted horizontally into the magnet system and scanned.

13. The magnet system of claim 11, wherein a subject is inserted vertically.

14. The magnet system of claim 11, wherein the magnet system is disposed to be erected horizontally.

15. The magnet system of claim 11, wherein the magnet system enables a stand-up scanning of an individual.

16. The magnet system of claim 11, wherein the magnet system is disposed to enable MRI scanning in an open environment.

* * * * *